(12) United States Patent
Park

(10) Patent No.: US 9,142,291 B2
(45) Date of Patent: Sep. 22, 2015

(54) HIGH VOLTAGE GENERATING CIRCUIT FOR RESISTIVE MEMORY APPARATUS

(71) Applicant: SK hynix Inc., Gyeonggi-do (KR)

(72) Inventor: Hae Chan Park, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 164 days.

(21) Appl. No.: 13/846,327

(22) Filed: Mar. 18, 2013

(65) Prior Publication Data

US 2014/0169065 A1 Jun. 19, 2014

(30) Foreign Application Priority Data

Dec. 14, 2012 (KR) .................. 10-2012-0146384

(51) Int. Cl.
| | | |
|---|---|---|
| *H01L 27/108* | (2006.01) | |
| *H01L 29/76* | (2006.01) | |
| *H01L 29/94* | (2006.01) | |
| *H01L 31/119* | (2006.01) | |
| *G11C 13/00* | (2006.01) | |

(52) U.S. Cl.
CPC ........ *G11C 13/0038* (2013.01); *G11C 13/0004* (2013.01)

(58) Field of Classification Search
CPC ............ H01L 21/8229; H01L 27/0922; H01L 27/0251; H01L 27/0629; H01L 28/40; H01L 21/0495; H01L 21/02576; H01L 21/02579; H01L 23/315; H01L 23/647; H01L 27/1085; H01L 27/0664; H01L 27/0794; H01L 27/11558; H01L 27/0805; H01L 27/098
USPC ........ 257/296, 288, 350, 298, 299, 300, 310, 257/311, 312, 774, E21.006, E21.007, 257/E21.051, E21.053, E21.267, E21.396, 257/E21.4, E21.421, E21.422, E21.435, 257/E21.645, E21.647, E21.352
See application file for complete search history.

(56) References Cited

U.S. PATENT DOCUMENTS

| | | | | |
|---|---|---|---|---|
| 6,084,796 A | * | 7/2000 | Kozicki et al. | 365/153 |
| 8,253,171 B1 | * | 8/2012 | Derderian et al. | 257/204 |
| 8,289,262 B2 | * | 10/2012 | Tsai et al. | 345/100 |
| 8,351,239 B2 | * | 1/2013 | Kim et al. | 365/148 |
| 8,659,940 B2 | * | 2/2014 | Bertin et al. | 365/167 |
| 2008/0158936 A1 | * | 7/2008 | Bertin et al. | 365/148 |

* cited by examiner

*Primary Examiner* — David Nhu
(74) *Attorney, Agent, or Firm* — IP & T Group LLP

(57) ABSTRACT

A high voltage generating circuit for a resistive memory apparatus is provided. The high voltage generating circuit includes a capacitor spaced from a semiconductor substrate and electrically insulated from the semiconductor substrate. A switching device, which is electrically connected to the capacitor, is electrically insulated from the semiconductor substrate.

12 Claims, 11 Drawing Sheets

FIG.4
10
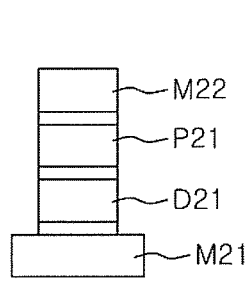
(a)
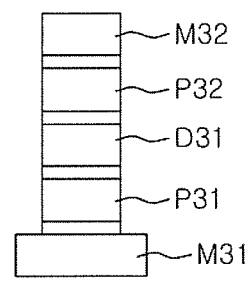
(b)
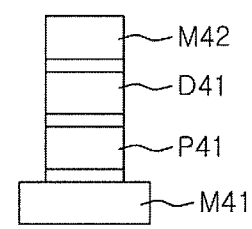
(c)

FIG.6
20
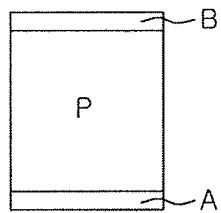
(a)
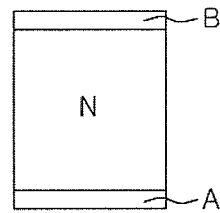
(b)
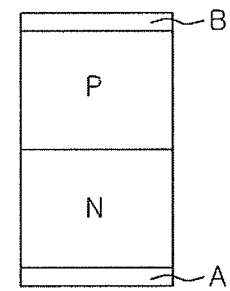
(c)

HIGH VOLTAGE GENERATING CIRCUIT FOR RESISTIVE MEMORY APPARATUS

CROSS-REFERENCES TO RELATED APPLICATION

This application claims priority under 35 U.S.C. 119(a) to Korean application number 10-2012-0146384, filed on Dec. 14, 2012, in the Korean Intellectual Property Office, which is incorporated by reference in its entirety.

BACKGROUND OF THE INVENTION

1. Technical Field

The inventive concept relates to a voltage boosting circuit, and more particularly, to a high voltage generating circuit for a resistive memory apparatus.

2. Related Art

High voltage generating circuits are circuits configured to boost an input voltage to a desired level and output the boosted voltage.

FIG. 1 is an illustrative view of a related high voltage generating circuit.

First, when a first switch S1 and a third switch S3 are closed, a power voltage VDD having an input voltage level is charged in a capacitor CAP. Subsequently, when the first switches S1 and the third switch S3 are opened and a second switch S2 is closed, a value of VDD*C is charged and held in the capacitor CAP. Assuming that there is no an output load, an output voltage twice the input voltage VDD can be obtained.

In semiconductor integrated circuits, the high voltage generating circuit is generally formed using a MOS transistor and a MOS capacitor. Since the MOS devices are used in the high voltage generating circuit, a silicon substrate has no choice but to be used in fabricating the high voltage generating circuit. A gate oxide layer constituting the MOS transistor and the MOS capacitor has a low dielectric constant. Therefore, an occupied area of the general high voltage generating circuit is inevitably increased in proportional to the output level.

Resistive memory apparatuses, particularly, phase-change random access memory (PCRAM) apparatuses require a large amount of current to transit a crystalline state of a phase-change material and thus the voltage level required to operate memory cells in a chip has to be increased. The high voltage generating circuit required to operate PCRAM cells is formed in a peripheral circuit area and will be described below with reference to FIG. 2.

FIG. 2 is an illustrative diagram of a related resistive memory apparatus, for example, a PCRAM device.

A semiconductor substrate 101 includes a cell area C and a peripheral circuit area P defined by a device isolation layer and memory cells 107 are formed in the cell area C. More specifically, a plurality of unit memory cells 107 are formed on an active region 105 of the cell area C and each unit memory cell 107 is electrically connected to a bit line 109 through a plug. The active region 105 is electrically connected to a word line 115 through a word line contact 111 and a dummy pattern 113. The reference numeral 103 designates a well region and the reference numeral 117 designates a global bit line.

The peripheral circuit area P may include a capacitor region Cap for high voltage generation, a transistor region Tr, and a logic circuit region Tr-L.

As illustrated in FIG. 2, a capacitor and transistor formed in a high voltage generation regions Cap and Tr are a silicon substrate-based MOS device. However, a gate oxide layer of a MOS transistor has a very low dielectric constant and thus, a size of the MOS capacitor is inevitably increased with increase in an output voltage level.

In a recently developed PCRAM, an, area share of a reservoir capacitor in a chip is approximately 17.2% and an area share of the reservoir capacitor to the peripheral circuit area is approximately 34.7%. An area share of a high voltage generating circuit in the chip is approximately 8.4% and an area share of the high voltage generating circuit to the peripheral circuit area is approximately 16.9%. Therefore, an area of the peripheral circuit area, occupied by the reservoir capacitor and the high voltage generating circuit reaches 51.6%

The semiconductor devices have been highly integrated and miniaturized increasingly and thus it is necessary to reduce in an occupied area or a size of the peripheral circuit area.

SUMMARY

An exemplary high voltage generating circuit for a resistive memory apparatus may include a capacitor spaced from a semiconductor substrate and electrically insulated from the semiconductor substrate; and a switching device spaced from the semiconductor substrate and electrically insulated from the semiconductor substrate, the switching device being electrically connected to the capacitor.

An exemplary high voltage generating unit may include a first metal capacitor to receive an internal voltage; a first metal diode-type switching device to transfer the internal voltage, or an output voltage of a previous stage of the high voltage generating unit, to an output terminal of the first metal capacitor; a second metal diode-type switching device connected between the output terminal of the first metal capacitor and an output terminal of the high voltage generating unit; and a second metal capacitor connected between the output terminal of the high voltage generating unit and a supply terminal of the internal voltage.

These and other features, aspects, and implementations are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which:

FIG. 4 is an illustrative view of an exemplary metal capacitor;

FIG. 6 is an illustrative view of an exemplary metal diode;

DETAILED DESCRIPTION

Figure 1:
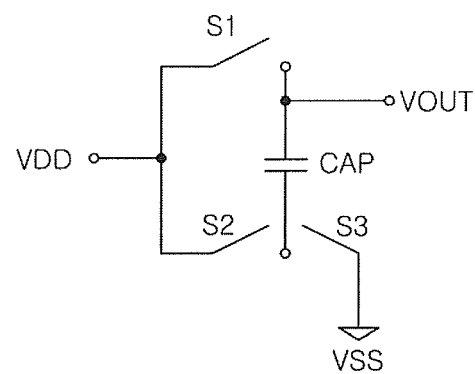
FIG. 1 is an illustrative view of a related high voltage generating circuit.

Hereinafter, exemplary implementations will be described in greater detail with reference to the accompanying drawings.

Exemplary implementations are described herein with reference to cross-sectional illustrations that are schematic illustrations of exemplary implementations (and intermediate structures). As such, variations from the shapes of the illustrations as a result, for example, of manufacturing techniques and/or tolerances, are to be expected. Thus, exemplary implementations should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Figure 3:
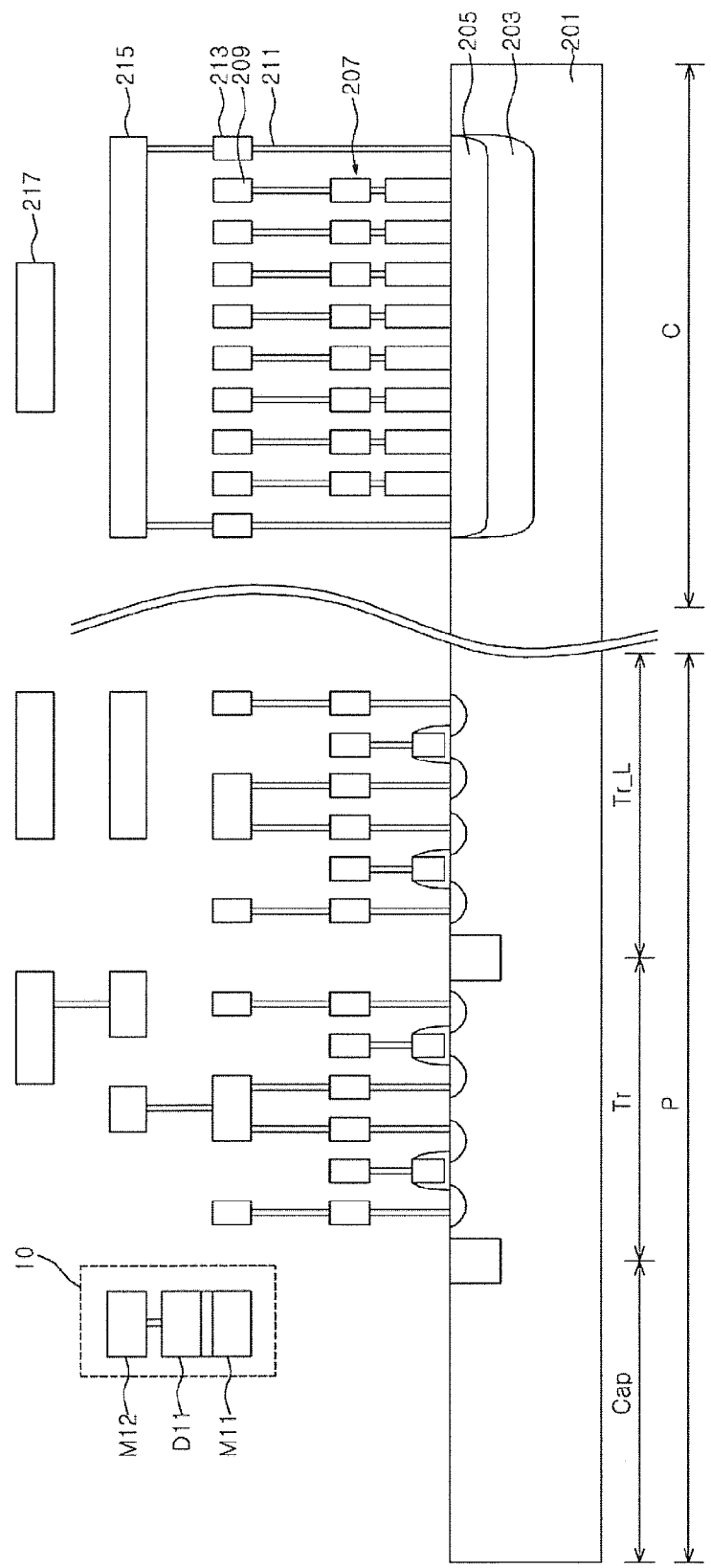
FIG. 3 is a view illustrating an exemplary high voltage generating circuit of a resistive memory apparatus.

FIG. 3 is a view illustrating a high voltage generating circuit of a resistive memory apparatus according to an exemplary implementation of the inventive concept.

A semiconductor substrate 201 is divided into a cell region C and a peripheral circuit area P by a device isolation layer. A plurality of unit memory cells 207 are formed on an active region 205 formed in a well 203. Here, each of the unit memory cells 207 may have a stacked structure including an access device, a lower electrode, a phase-change material layer, or an upper electrode; but, the structure of the unit memory cell is not limited thereto. The unit memory cells 207 are electrically connected to corresponding bit lines 209. The active region 205 is connected to a word line 215 through a word line contact 211 and a dummy pattern 213. The bit lines 209 are connected to a global bit line 217 in unit of a specified number.

The peripheral circuit area P may include a capacitor area Cap configured to generate a high voltage, a switching device area Tr, and a logic circuit area Tr_L.

Specifically, in the capacitor area Cap (illustrated in FIG. 3), a metal capacitor 10 may be spaced from the semiconductor substrate 201 and be electrically insulated from the semiconductor substrate 201.

The metal capacitor 10 may have a structure in which a dielectric layer D11 is interposed between a first metal layer M11 (lower metal layer) and a second metal layer M12 (upper metal layer) and is called a metal-insulator-metal (MIM) capacitor. The metal capacitor 10 may have various structures, examples of which are shown in FIG. 4.

A metal capacitor 10, as illustrated in FIG. 4(a), has a structure in which a metal layer M21, a first dielectric layer D21, polysilicon layer P21 and a second metal layer M22 are stacked.

A metal capacitor 10, as illustrated in FIG. 4(b), has a structure in which a first metal layer M31, a first polysilicon layer P31, a dielectric layer D31, a second polysilicon layer P32, and a second metal layer M32 are stacked.

A metal capacitor 10, as illustrated in FIG. 4(c), has having a structure in which a first metal layer M41, a polysilicon layer P41, a dielectric layer D41, and a second metal layer M42 are stacked.

The structure of the metal capacitor 10 is not limited to the structures of FIGS. 3 and 4 and all structures in which a dielectric layer is interposed between a pair of metal layers may be applied to the metal capacitor 10.

When the metal capacitor is used as the capacitor for the high voltage generating circuit, a dielectric layer having a high dielectric constant may be introduced. Therefore, a small-sized capacitor having high storage performance may be provided. Further, the metal capacitor has good linearity and low parasitic capacitance.

The following Table 1 illustrates a capacitance value according to a dielectric constant of a dielectric material.

TABLE 1

| Dielectric material | Dielectric constant |
| --- | --- |
| $SiO_2$ | 3.7 |
| $Al_2O_3$ | 8 |
| SBT | 250 |

It can be seen from Table 1 that $Al_2O_3$ or SBT has a dielectric constant higher than $SiO_2$. For example, if a MOS capacitor is implemented in an area of 10 μm×10 μm, then the capacitance value is about 0.664 pF. If the metal capacitor is implemented using $Al_2O_3$, then the capacitance value is observed as about 1.461 pF. Therefore, it can be seen that the metal capacitor has a capacitance value about 2.2 times higher than that of the MOS capacitor in the same area.

Therefore, the metal capacitor is implemented using a material having a high dielectric constant, so that the high voltage generating circuit having a small size and good efficiency may be configured.

Further, in the exemplary implementation, the metal capacitor 10 may be formed in the same layer as a layer on which the bit line 209 is formed, but it is not limited thereto.

Figure 5:
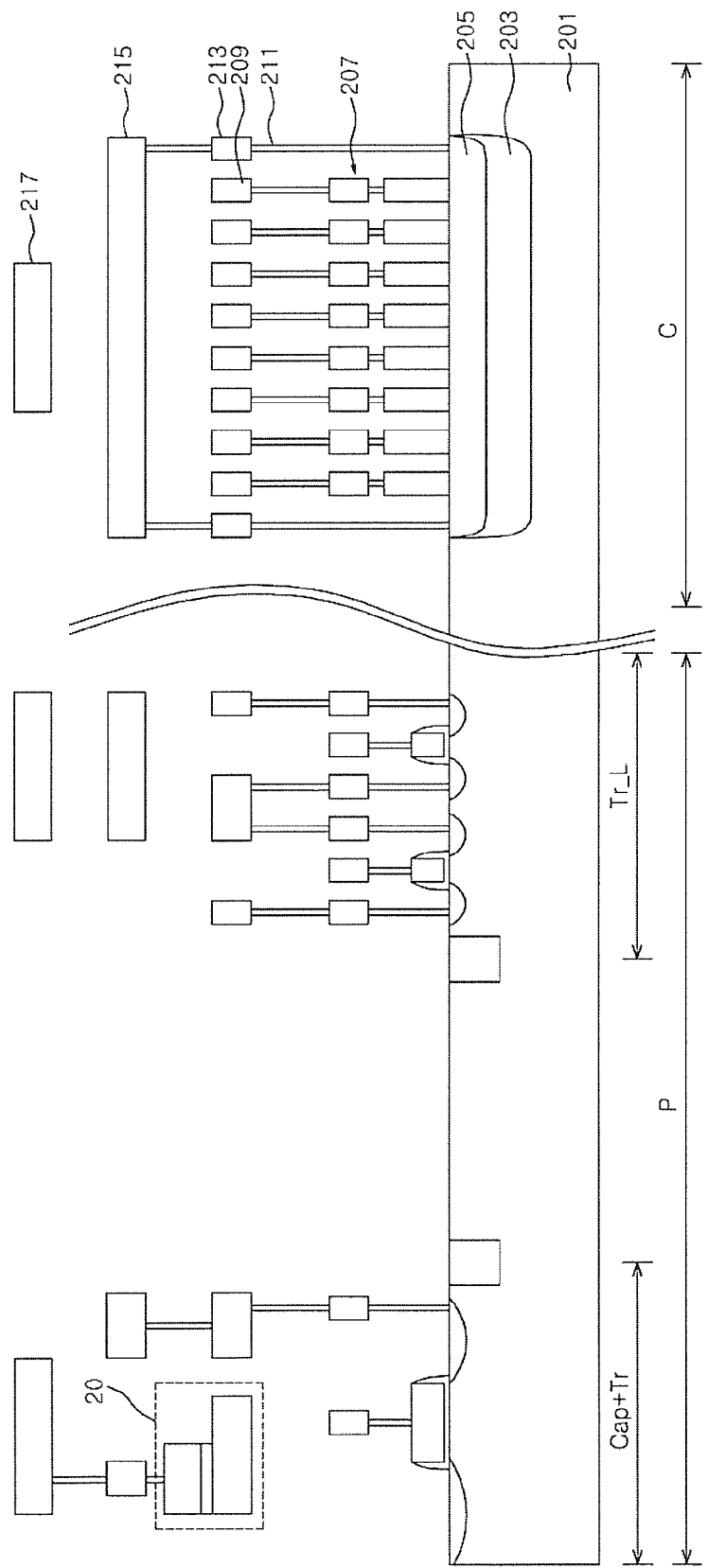
FIG. 5 is a view illustrating an exemplary high voltage generating circuit of a resistive memory.

FIG. 5 is a view illustrating a high voltage generating circuit of a resistive memory apparatus, in which a metal diode is used as a switching device.

The resistive memory apparatus illustrated in FIG. 5 has a cell area C and a logic circuit area Tr_L similar to those of FIG. 3. The switching device in FIG. 3 is formed in a switching device area Tr for high voltage generation. However, in the exemplary implementation, the switching device is configured of a metal diode and disposed together with a capacitor in the capacitor area, that is, a capacitor and switching device area Cap+Tr.

Referring to FIG. 5, a diode-type switching device 20 is formed in the capacitor and switching device area Cap+Tr, is spaced from a semiconductor substrate 201, and is electrically insulated from the semiconductor substrate 201. In the exemplary implementation, the metal diode-type switching device 20 may be formed on the same layer as a layer on which a bit line 209 is formed, but it is not limited thereto.

The diode-type switching device 20 may be selected from adaptable configurations of metal diodes, such as a P type diode, an N type diode, or a PN junction diode. FIG. 6 illustrates examples of metal diodes.

FIG. 6(a) illustrates a metal diode having a structure in which a P type semiconductor material is inserted between a Schottky contact layer A and an ohmic contact layer B. FIG. 6(b) illustrates a metal diode having a structure in which an N type semiconductor material is inserted between a Schottky contact layer A and an ohmic contact layer B. FIG. 6(c) illustrates a metal diode having a structure in which PN junction semiconductor materials P and N are inserted between a Schottky contact layer A and an ohmic contact layer B. The metal diode-type is not limited thereto and a stacking position of the Schottky diode A and the ohmic contact layer B is also limited thereto.

In the high voltage generating circuit illustrated in FIG. 5, the metal diode is adapted as a switching diode than a MOS transistor in which a silicon substrate is used as a base and thus the metal diode is disposed together in the capacitor area. Therefore, the existing switching device area Tr is unnecessary and thus, may be eliminated.

As described above, a metal capacitor or a metal diode-type switching device are used, so that the high voltage generating circuit having improved charging pumping efficiency in a limited area is provided and miniaturization of the resistive memory apparatus is promoted.

FIGS. 7 to 10 are views illustrating exemplary high voltage generating circuits for a resistive memory apparatus.

Figure 7:
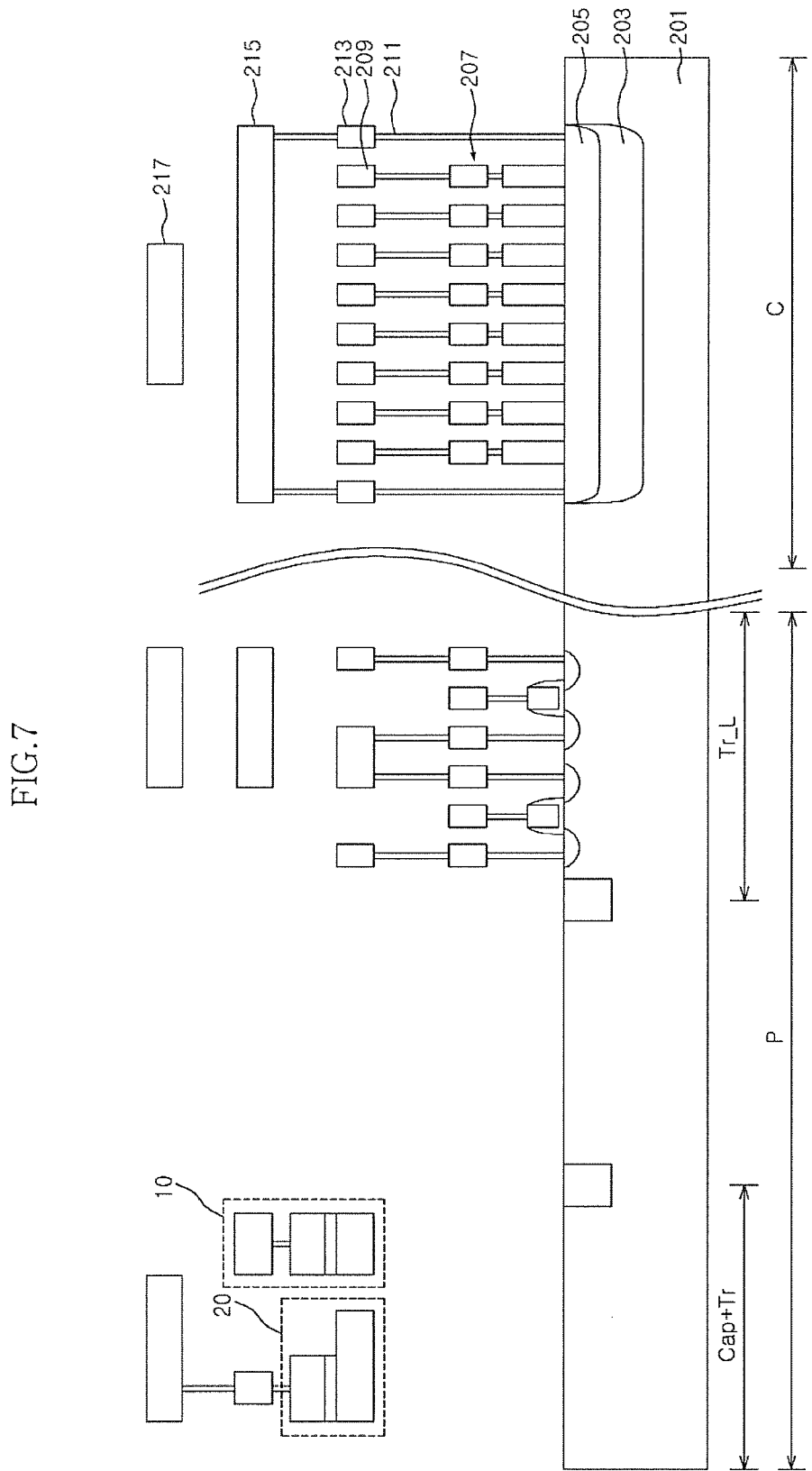
FIGS. 7 to 10 are views illustrating exemplary high voltage generating circuits of resistive memory apparatuses.
Figure 8:
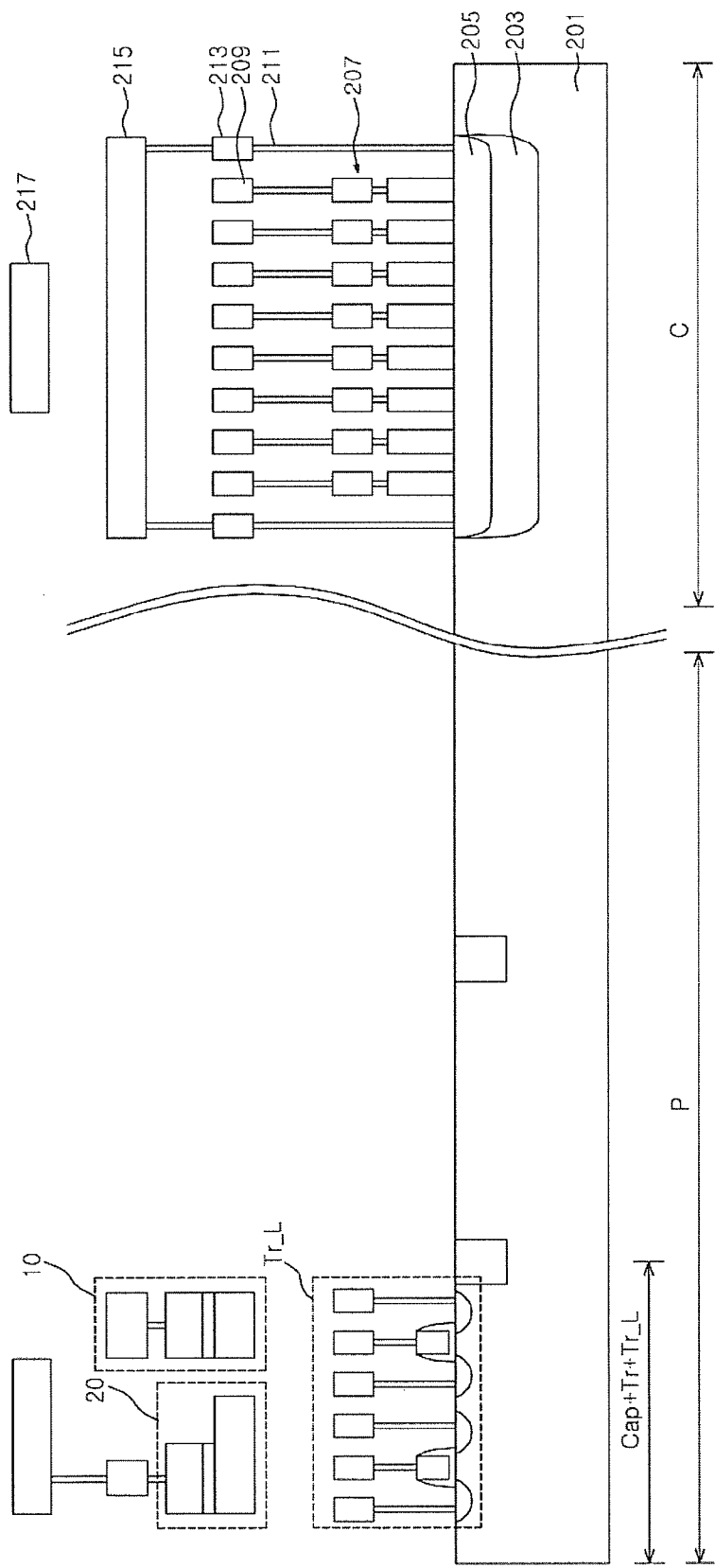

First, FIGS. 7 and 8 illustrates cases in which both a metal capacitor 10 and a diode-type switching device 20 are configured of metal base devices and are formed on a separate lower metal layer.

Figure 2:
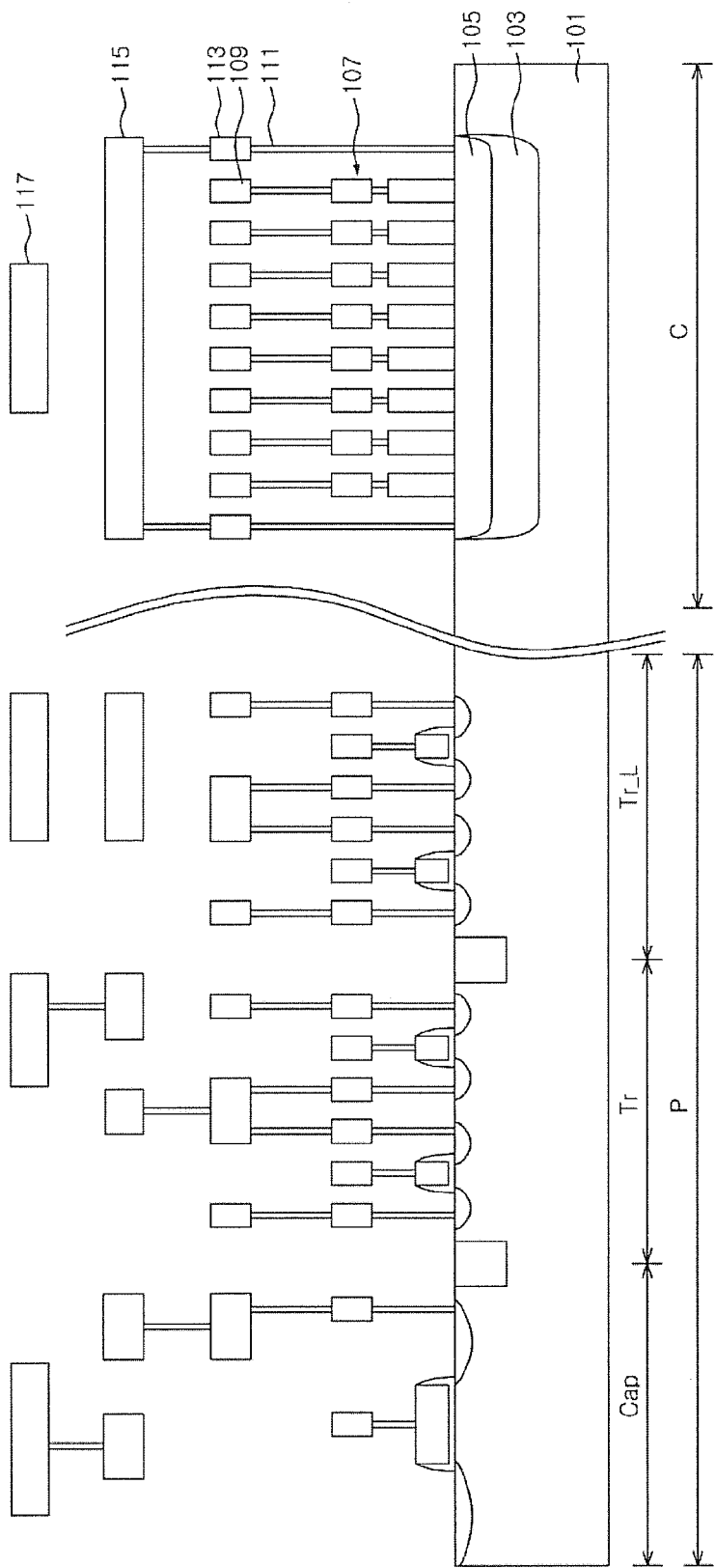
FIG. 2 is an illustrative view of a related resistive memory apparatus.

Referring to FIG. 7, it can be seen that the metal capacitor 10 and the metal diode-type switching device 20 are formed in a capacitor and switching device area Cap+Tr of the peripheral circuit area P. A dielectric material having a high dielectric constant may be applied according to adaptation of the metal capacitor 10, thereby, an area occupied by the metal capacitor is reduced and the charging efficiency of the metal capacitor is improved. Further, a portion corresponding to a conventional switching device region Tr (as shown in FIG. 2) may be omitted due to use of the metal diode-type switching device 20. Thus, miniaturization of a total semiconductor device can be obtained.

When the metal capacitor 10 and the metal diode-type switching device 20 are configured as illustrated in FIG. 7, a region underlying the metal capacitor 10 and the metal diode-type switching device 20, located in the capacitor and switching device area Cap+Tr, are in an idle are As illustrated in FIG. 8, a region underlying a metal capacitor 10 and a metal diode-type switching device 20 may be used as a logic circuit area Tr_L. Thus, both the switching device area Tr and logic circuit area Tr_L can be omitted, and the capacitor area, the switching area, and the logic circuit area may be disposed in a common area, so that an occupied area of a peripheral circuit area P is greatly reduced.

Figure 9:
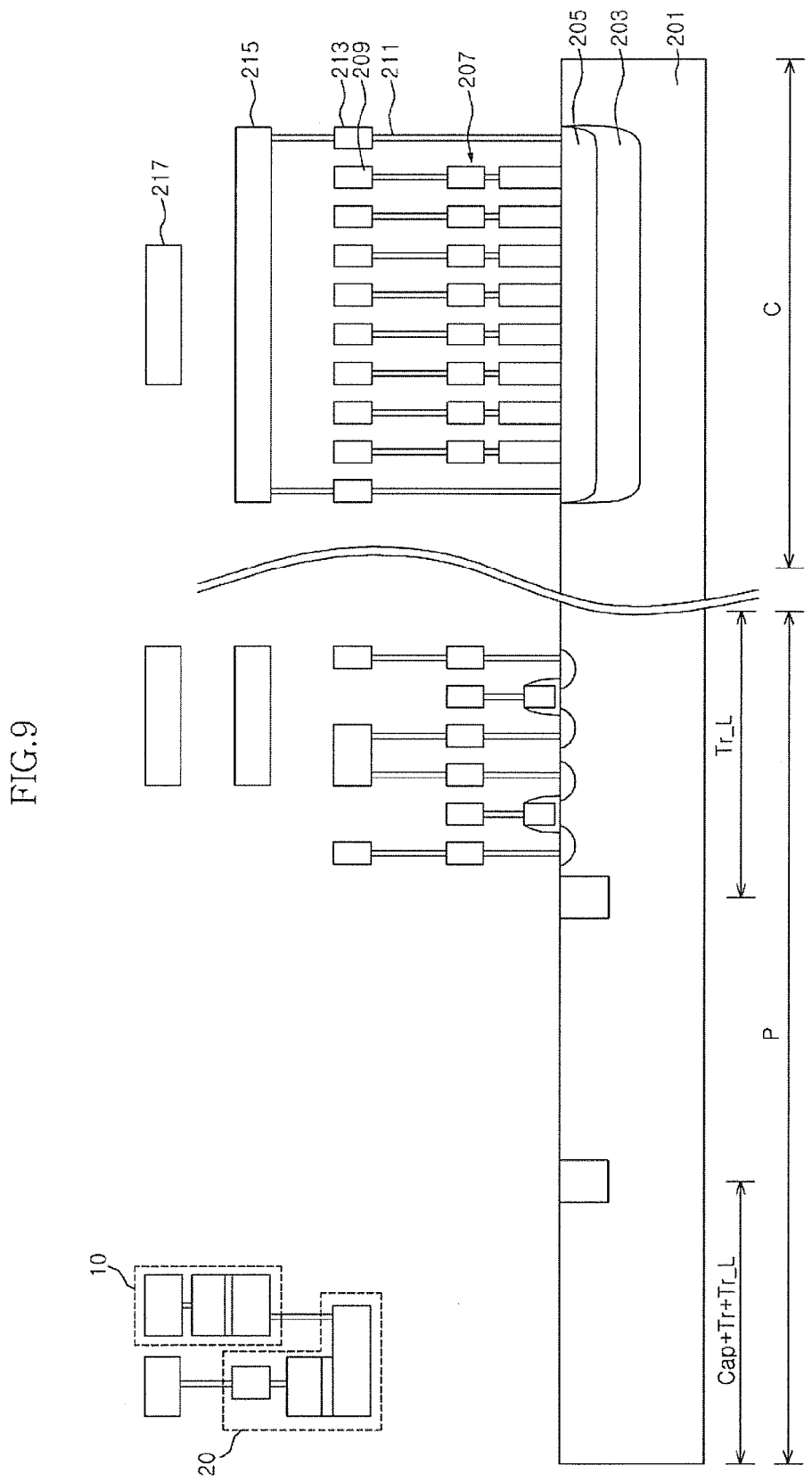
Figure 10:
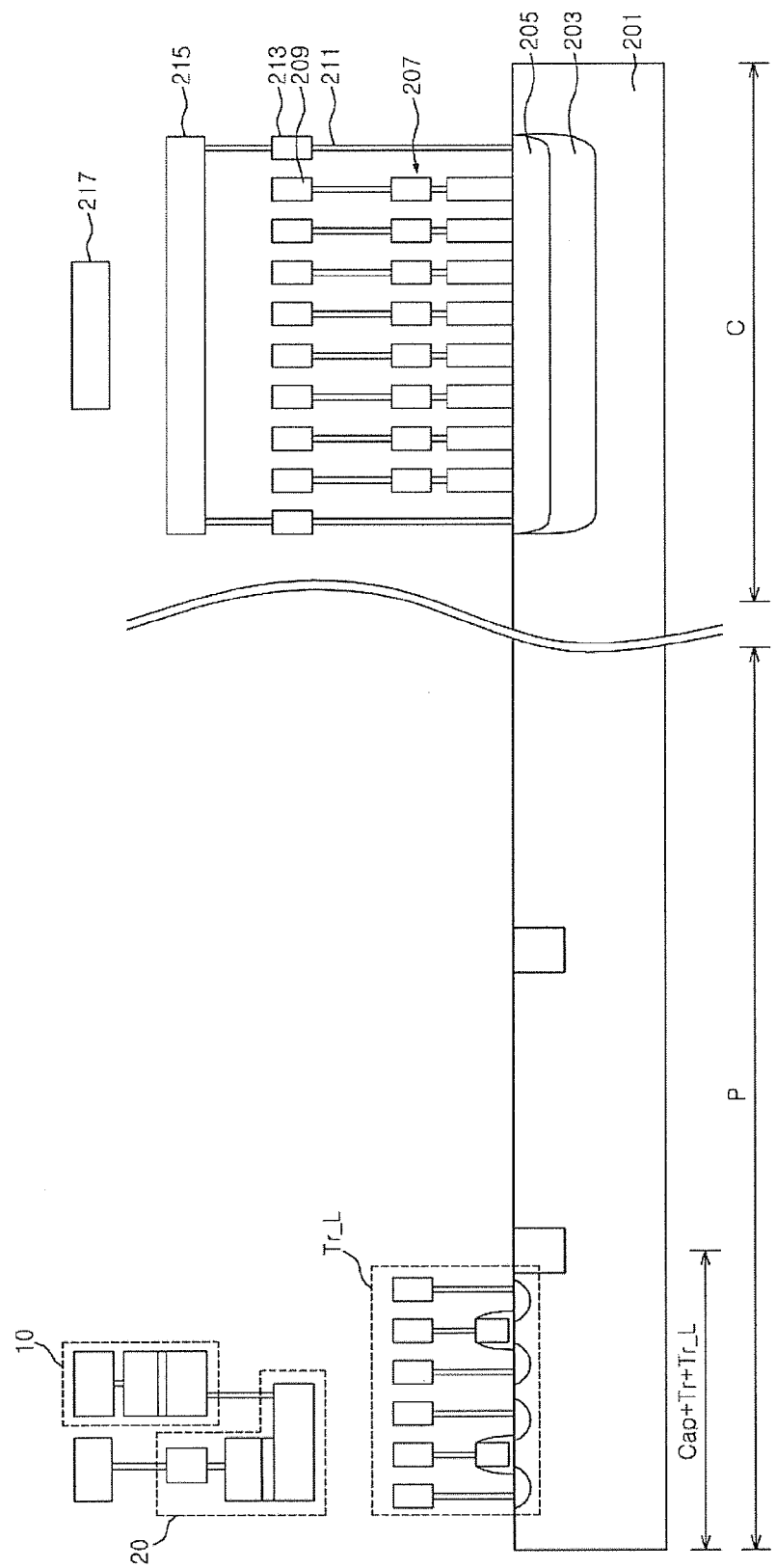

FIGS. 9 and 10 illustrate exemplary cases in which both a capacitor and a switching device are configured of a metal base device and the metal capacitor 10 and the metal diode-type switching device 20 share a lower metal layer.

Referring to FIG. 9, it can be seen that the metal capacitor 10 and the metal diode-type switching device 20 are formed in a capacitor and switching device area Cap+Tr on the same lower metal layer. Therefore, an area occupied by the lower metal layer for the metal capacitor 10 is also saved and thus, an area occupied by the high voltage generating circuit is reduced.

Further, when a logic circuit area Tr_L is disposed in a region underlying the metal capacitor 10 and the metal diode-type switching device 20, as illustrated in FIG. 10, both the existing switching device area Tr and logic circuit area Tr_L are omitted so that an occupied area of a peripheral circuit area P is greatly reduced.

In the above-described resistive memory apparatuses illustrated in FIGS. 3, 4, and 7 to 10, the metal capacitor 10 and the metal diode-type switching device 20 are electrically connected to form the high voltage generating circuit.

Figure 11:
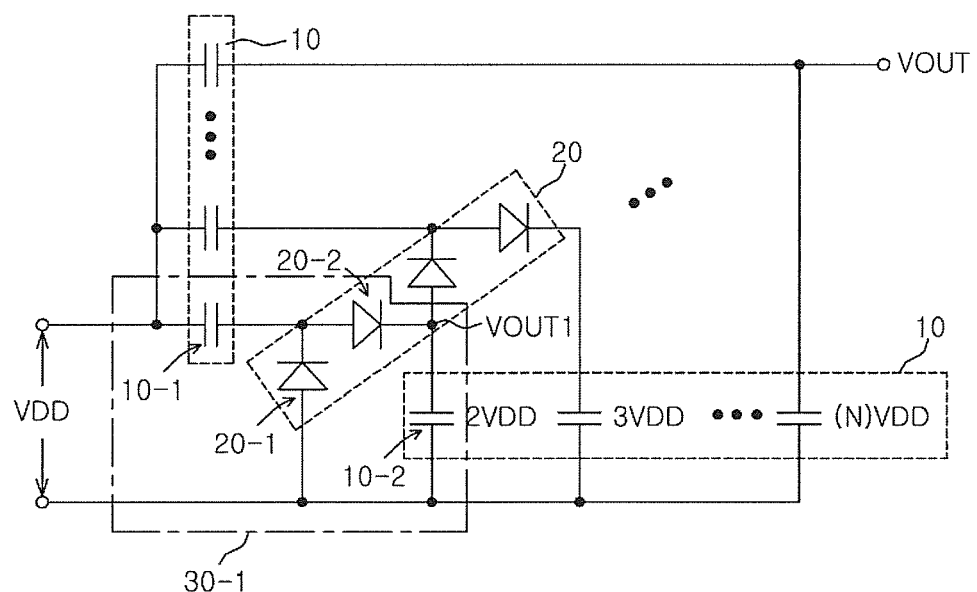
FIG. 11 is a view illustrating a configuration of an exemplary high voltage generating unit.

FIG. 11 is a view illustrating a configuration of an exemplary high voltage generating circuit.

As illustrated in FIG. 11, a high voltage generating circuit 30 according to exemplary implementations of the inventive concept may include at least one stage of a high voltage generating unit 30-1.

Here, the unit high voltage generating unit 30-1 may include a first metal capacitor 10-1, configured to receive an internal voltage VDD and charge, a first metal diode-type switching device 20-1, configured to transfer an output voltage of a previous stage of a unit high voltage generating unit 30-1 to an output terminal of the first metal capacitor 10-1, a second metal diode-type switching device 20-2, connected between the output terminal of the first metal capacitor 10-1 and an output terminal Vout1 of the unit high voltage generating unit 30-1, and a second metal capacitor 10-2, connected between the output terminal Vout1 of the unit high voltage generating unit 30-1 and a supply terminal of the internal voltage VDD, and configured to charge.

If the high voltage generating circuit 30 is configured in one stage, then the output voltage becomes 2VDD. If the high voltage generating circuit 30 is configured in N stages, then the output voltage N*VDD is output from the high voltage generating circuit 30.

Further, the second metal capacitor of the final stage may be used as a reservoir capacitor.

The metal capacitor 10 and the metal diode-type switching device 20 are formed using a metal layer as a base, as illustrated in FIGS. 3, 5, and 7 to 10. In particular, since the metal capacitor 10 may be formed using a material having high dielectric constant, pumping efficiency is maximized even in a small size. Further, since the metal capacitor 10 and the metal diode-type switching device 20 are formed over the silicon substrate, and the logic circuit is disposed in a layer below the metal capacitor 10 and the metal diode-type switching device 20, a total size of a semiconductor memory apparatus can be greatly reduced.

The above implementation of the present invention is illustrative and not limitative. Various alternatives and equivalents are possible. The invention is not limited by the implementation described herein. Nor is the invention limited to any specific type of semiconductor device. Other additions, subtractions, or modifications are obvious in view of the present disclosure and are intended to fall within the scope of the appended claims.

What is claimed is:

1. A circuit for a resistive memory apparatus, which generates an operation voltage of a memory cell, a high voltage generating circuit comprising:
    a capacitor spaced from a semiconductor substrate and electrically insulated from the semiconductor substrate; and
    a switching device spaced from the semiconductor substrate and electrically insulated from the semiconductor substrate, the switching device being electrically directly connected to the capacitor.

2. The circuit for a resistive memory apparatus of claim 1, wherein the capacitor includes a metal-insulator-metal (MIM) capacitor.

3. The circuit for a resistive memory apparatus of claim 2, wherein the MIM capacitor comprises:
    a first metal layer,
    a first dielectric layer formed on the first metal layer,
    a polysilicon layer formed on the first dielectric layer, and
    a second metal layer formed on the polysilicon layer.

4. The circuit for a resistive memory apparatus of claim 2, wherein the MIM capacitor comprises:
    a first metal layer,
    a first polysilicon layer formed on the first metal layer,
    a first dielectric layer formed on the first polysilicon layer,
    a second polysilicon layer formed on the first dielectric layer, and
    a second metal layer formed on the second polysilicon layer.

5. The circuit for a resistive memory apparatus of claim 2, wherein the MIM capacitor comprises:
    a first metal layer,
    a polysilicon layer formed on the first metal layer, a dielectric layer formed on the polysilicon layer, and
a second metal layer formed on the dielectric layer.

6. The circuit for a resistive memory apparatus of claim 2, wherein the memory cell is a resistive memory cell and the MIM capacitor is formed on a layer on which a bit line of the resistive memory cell is formed.

7. The circuit for a resistive memory apparatus of claim 1, wherein the switching device is a metal diode.

8. The circuit for a resistive memory apparatus of claim 7, wherein the switching device has a structure in which a P type semiconductor material is interposed between a Schottky contact layer and an ohmic contact layer.

9. The circuit for a resistive memory apparatus of claim 7, wherein the switching device has a structure in which an N type semiconductor material is interposed between a Schottky contact layer and an ohmic contact layer.

10. The circuit for a resistive memory apparatus of claim 7, wherein the switching device has a structure in which a PN junction semiconductor material is interposed between a Schottky contact layer and an ohmic contact layer.

11. The circuit for a resistive memory apparatus of claim 7, wherein the memory cell is a resistive memory cell and the switching device is formed on a layer on which a bit line of the resistive memory cell is formed.

12. The circuit for a resistive memory apparatus of claim 1, further comprising:
    a logic switching circuit formed in a space between the capacitor and the switching device.

* * * * *